United States Patent
Gluschenkov et al.

(10) Patent No.: US 9,620,396 B1
(45) Date of Patent: Apr. 11, 2017

(54) LASER ANNEAL OF BURIED METALLIC INTERCONNECTS INCLUDING THROUGH SILICON VIAS

(71) Applicant: INTERNATIONAL BUSINESS MACHINES CORPORATION, Armonk, NY (US)

(72) Inventors: Oleg Gluschenkov, Tannersville, NY (US); Andrew J. Martin, Carmel, NY (US); Joyeeta Nag, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,308

(22) Filed: Jun. 30, 2016

Related U.S. Application Data (62) Division of application No. 14/972,630, filed on Dec. 17, 2015, now Pat. No. 9,455,185.

(51) Int. Cl.
  *H01L 21/324* (2006.01)
  *H01L 21/02* (2006.01)
  *H01L 21/67* (2006.01)
  *H01L 21/768* (2006.01)
  *H01L 23/532* (2006.01)
  *H01L 23/528* (2006.01)
  *B23K 26/06* (2014.01)
  *B23K 26/00* (2014.01)
  *C22F 1/04* (2006.01)
  (Continued)

(52) U.S. Cl.
  CPC .... *H01L 21/67115* (2013.01); *B23K 26/0006* (2013.01); *B23K 26/0619* (2015.10); *C22F 1/04* (2013.01); *C22F 1/10* (2013.01); *C22F 1/18* (2013.01); *H01L 21/76894* (2013.01); *H01L 23/528* (2013.01); *H01L 23/53214* (2013.01); *H01L 23/53233* (2013.01); *H01L 23/53257* (2013.01); *B23K 2201/42* (2013.01); *B23K 2203/172* (2015.10)

(58) Field of Classification Search
  CPC .............. H01L 21/268; H01L 27/1464; H01L 21/02675; H01L 21/324; H01L 21/67115
  USPC ................ 438/795, 308, 660; 257/E21.347; 427/554
  See application file for complete search history.

(56) References Cited

U.S. PATENT DOCUMENTS

| | | | | |
|---|---|---|---|---|
| 6,524,877 B1 * | 2/2003 | Nakazawa | .......... | H01L 27/1281 257/40 |
| 2014/0057457 A1 * | 2/2014 | Wang | ................ | H01L 21/02107 438/778 |
| 2014/0145272 A1 * | 5/2014 | Or-Bach | ............. | H01L 27/0688 257/369 |

OTHER PUBLICATIONS

Gluschenkov et al., "Laser Anneal of Buried Metallic Interconnects Including Through Silicon Vias," U.S. Appl. No. 14/972,630, filed Dec. 17, 2015.

(Continued)

*Primary Examiner* — David Vu
*Assistant Examiner* — Jonathan Han
(74) *Attorney, Agent, or Firm* — Cantor Colburn LLP; Jennifer Anda (57) ABSTRACT

Disclosed is a process of annealing through silicon vias (TSVs) or other deeply buried metallic interconnects using a back side laser annealing process. The process provides several advantages including sufficient grain growth and strain relief of the metal such that subsequent thermal processes do not cause further grain growth; shorter anneal times thereby reducing cycle time of 3D device fabrication; and reduced pattern sensitivity of laser absorption.

9 Claims, 2 Drawing Sheets

(51) Int. Cl.
*C22F 1/10* (2006.01)
*C22F 1/18* (2006.01)
*B23K 101/42* (2006.01)
*B23K 103/16* (2006.01)

(56) References Cited

OTHER PUBLICATIONS

List of IBM Patents or Patent Applications Treated As Related; Date Filed: Jun. 30, 2016, pp. 1-2.

* cited by examiner

LASER ANNEAL OF BURIED METALLIC INTERCONNECTS INCLUDING THROUGH SILICON VIAS

CROSS-REFERENCE TO RELATED APPLICATIONS

This application is a division of U.S. application Ser. No. 14/972,630, filed Dec. 17, 2015, the contents of which are hereby incorporated by reference in its entirety.

BACKGROUND

The present invention generally relates to a method of annealing deeply buried metallic interconnects, such as through silicon vias (TSVs) and other metallic interconnects of an integrated circuit (IC).

Three dimensional (3D) integrated circuits are prepared by stacking wafers and/or dies and interconnecting them using a vertical electrical connection (via), such as a TSV, or other deeply buried metallic interconnect. TSV extends through the entire thickness of a finished substrate to make electrical connections between stacked wafers or dies. Accordingly, TSV is a metallic interconnect deeply buried within substrate.

TSV and other buried metallic interconnects are most commonly made from copper to reduce their electrical resistivity. After copper deposition, TSV fabrication often includes annealing steps that may grow the copper grain size, may alter stress in the metal, and may induce a plastic deformation of the metal. Current methods for annealing TSVs use a mild heat exposure, typical for forming copper interconnects, with highest temperature not exceeding 400° C. (e.g. 375° C.) for an extended period of time (e.g. about 2 and up to 6 hours). Extended annealing makes the temperature uniform throughout substrate thickness leading to an isothermal annealing of any deeply buried interconnects. Annealing at these temperatures for an extended time period results in copper grain growth along the full length and width of the TSV, which in some instances can reach up to about 55 micrometers into the substrate and can be of large diameter (upward of 6 to 19 micrometers). A post TSV anneal may be of substantially high temperature (e.g. 375° C.) for a long duration to ensure that subsequent exposure of the TSV to any thermal heating during further processing steps of IC fabrication do not result in further grain growth and upward expansion of the metal, which can cause cracking of wiring levels/dielectric films above the TSVs. A problem with such additional post TSV annealing for an extended time period is that it adds to the overall device thermal budget beyond what 2D structures experience and may lead to the plastic deformation of metal. Furthermore, the long anneals add significant processing time for 3D device fabrication, making the process costly.

Millisecond scale annealing of metallic interconnects can be conducted at a much higher temperature, up to the melting point of metal (e.g. copper at 1085° C.) without detrimental effects associated with longer anneals at lower temperatures. It has been shown that such high-temperature millisecond-scale annealing results in substantial copper grain growth. However, millisecond scale annealing confines the region of high temperature annealing to within the proximity of wafer surfaces creating obstacles to uniform annealing of deep, buried metallic interconnects.

SUMMARY

In one embodiment, a method comprises laser annealing a front side metallic interconnect from the back side of a structure comprising, from back to front, a transparent material substrate, an absorbing material region, and a semiconductor device region, wherein the metallic interconnect is located within the absorbing material region and semiconductor device region forming a vertical electrical connection (via), and wherein the laser annealing is conducted with a laser having a wavelength where the transparent material substrate does not substantially absorb the laser radiation and where the absorbing material region absorbs the laser radiation such that heat is generated and diffuses through the absorbing material.

In another embodiment, a method comprises providing a structure comprising a transparent material substrate which forms the back side of the structure, an absorbing material region located to the front of the transparent material substrate opposite to the back side of the structure, a semiconductor device region located to the front of the absorbing material region opposite to the transparent material substrate, and a metallic interconnect located within the absorbing material region and semiconductor device region forming a vertical electrical connection (via); and laser annealing the metallic interconnect through the back side of the structure, wherein the laser annealing is conducted with a laser having a wavelength where the transparent material substrate does not substantially absorb the laser radiation and where the absorbing material region absorbs the laser radiation such that heat is generated and diffuses through the absorbing material.

In yet another embodiment, a method comprises providing a structure comprising, from back to front, an undoped or minimally doped material substrate which forms the back side of the structure, a doped material region located in front of the undoped or minimally doped material substrate opposite to the back side of the structure, a semiconductor device region located in front of the doped material region opposite to the undoped or minimally doped material substrate, a metallic interconnect located within the doped material region and semiconductor device region forming a vertical electrical connection (via), back end of line (BEOL) or middle of line (MOL) component region contacting the surface of the doped material region, and a sacrificial protective layer over the surface of the semiconductor device region, the metallic interconnect, and back end of line (BEOL) or middle of line (MOL) component region; laser annealing the metallic interconnect through the back side of the structure using an infrared laser, wherein the doped material region absorbs laser radiation; and optionally laser annealing the metallic interconnect through a front side of the structure.

In another embodiment, an apparatus for laser annealing deep metallic interconnects comprises a first laser with a first wavelength and a first coupling device, and a second laser with a second wavelength, shorter than the first wavelength, and a second coupling device, wherein the first coupling device couples laser radiation from the first laser to the back side of a target structure to be laser annealed and the second coupling device couples the second laser radiation from the second laser to the front side of the target structure to be laser annealed; wherein the target structure contain, from back to front, a transparent material substrate which forms the back side of the structure, a semiconductor device region located in front of the transparent material substrate opposite to the back side of the structure, a metallic interconnect located within the transparent material substrate and semiconductor device region forming a vertical electrical connection (via), and optional back end of line (BEOL) or middle of line (MOL) component region located in front of the transparent material substrate, and wherein the second laser radiation creates an absorbing material region and the first laser radiation couples into the created absorbing material and heats it to an annealing temperature sufficient to anneal the metallic interconnect present therein.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As stated above, the present invention relates to a method of annealing TSV or other deep metallic interconnects using laser annealing. The method involves a back side, through-wafer laser anneal (i.e. through the back of a wafer) to anneal deep metallic interconnects such as TSV or other buried metallic interconnects located toward the wafer front. The method allows for a uniform anneal over the length and width of the deeply buried metallic interconnect for sufficient grain growth. The advantage of back side, through-wafer laser annealing is to effect localized heating in the area of the deep buried metallic interconnects instead of overall heating of the entire structure as in the case of isothermal annealing or purely surface heating as in the case of front side laser annealing, thereby allowing for a uniform millisecond scale annealing of deep, buried metallic interconnects. Back side laser annealing also has the advantage of a reduced pattern density sensitivity of laser absorption, i.e. there are no varying features to reflect the laser beam from the back surface and reduce energy absorption with the substrate.

In general, the annealing process involves laser annealing a front-side metallic interconnect from the wafer back side. The structure comprises, from back to front, a transparent material substrate, an absorbing material region, and a semiconductor device region, wherein the metallic interconnect is located within the absorbing material region and semiconductor device region. The laser annealing is conducted with a laser having a wavelength where the transparent material substrate does not substantially absorb the laser radiation yet where the absorbing material region absorbs the laser radiation such that heat is generated and diffuses through the absorbing material sufficient to anneal the metallic interconnect. The selection of the particular transparent material substrate, absorbing material region, and laser wavelength can be made by one having ordinary skill in the art without under experimentation. The method is now described in detail with accompanying figures. Like reference numerals refer to like elements across different embodiments. The figures are not to scale.

Figure 1:
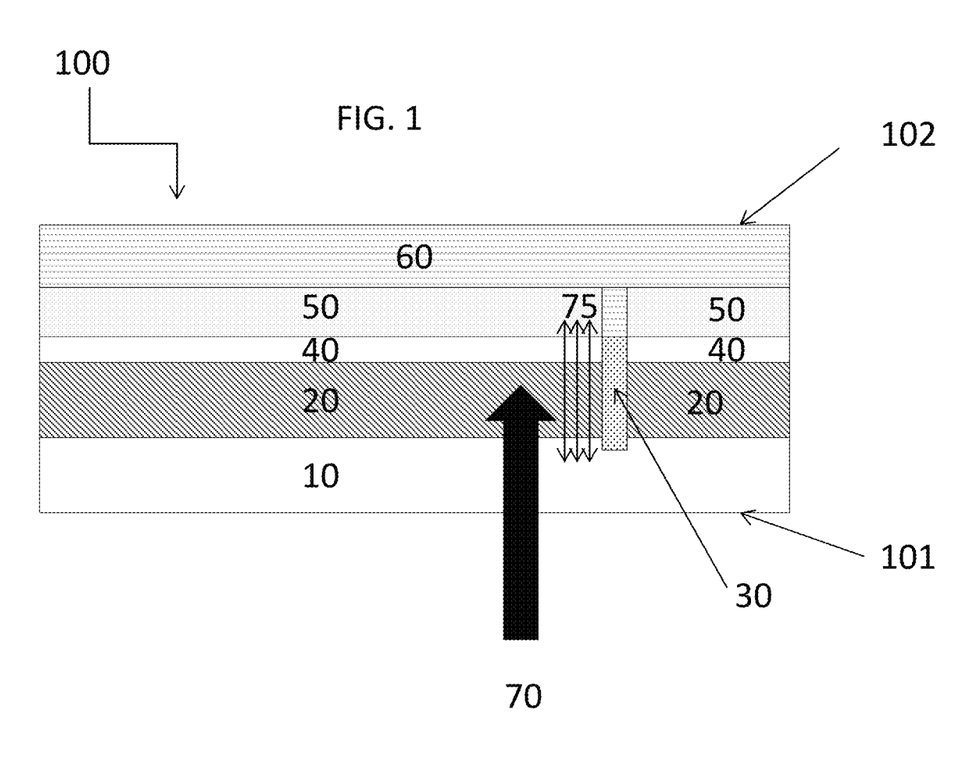
FIG. 1 is a schematic of laser annealing a metallic interconnect from the back side of a first structure.

The present method of annealing deep metallic interconnects uses short-scale laser annealing from the back side of the wafer to heat the front side deep metallic interconnects. FIG. 1 is an exemplary embodiment of the present invention where structure (100) has a back side surface (101) and a front side (102). Structure (100) contains a transparent material substrate (10), an absorbing material region (20), a deep metallic interconnect (30), a semiconductor device region (40), an optional back end of line (BEOL) or middle of line (MOL) component region (50), and an optional sacrificial protective layer (60). Laser radiation (70) emitted from a laser source (not shown) enters through the back side surface (101) of structure (100) and travels through the transparent material substrate (10) without being substantially absorbed by the transparent material. The laser radiation (70) travels into and is absorbed by the absorbing material region (20) surrounding the TSV or metallic interconnect (30). The laser energy used is high enough to heat the absorbing material region to a sufficient annealing temperature, the heat diffuses (75) through the absorbing material region (as shown by the double-headed arrows (75) in FIG. 1) to heat the deep metallic interconnect, thereby annealing the metal therein. As shown in FIG. 1, by controlling the laser annealing process, the heat (75) can diffuse down through the absorbing material region (20) to a portion of the transparent material substrate (10) and the heat (75) can diffuse up to a portion of the semiconductor device region (40) and optional back end of line (BEOL) or middle of line (MOL) component region (50).

The deep metallic interconnects (30), including TSVs, can be made in part from copper, a copper alloy, aluminum (Al), cobalt (Co), tungsten (W), or the like. Other metals and metal alloys can be used. The particular shape of the metallic interconnect is not limited and can be in the form of a cylinder, rectangular prism, square prism, cubic, tube (hollow cylinder), variants thereof, and the like. In the example where the metallic interconnect has a tube (hollow cylinder) shape, the center of the tube can optionally contain the same material as the absorbing material region (20).

The absorbing material region (20) is generally prepared from any material that can absorb the laser radiation and thus generate heat, which diffuses through the absorbing material region (as shown by the double-headed arrows (75) in FIG. 1) to heat the deep metallic interconnect, thereby annealing the metal therein.

In an embodiment, the absorbing material region is a doped material region prepared from a semiconductor material doped with a dopant. Suitable semiconductor material for the doped material region includes, for example, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Exemplary dopants for a silicon semiconductor material include, for example, Group III and Group V elements, specifically antimony, arsenic, boron, gallium, indium, phosphorus, or a combination thereof. Exemplary dopants for a GaAs semiconductor material include Group IV elements.

The doped material region is doped to a dopant concentration in a range from about 3e18 to about 1e21 atoms/cm$^3$. In one aspect, the doped material region is doped to a dopant concentration in a range from about 2e19 to about 1e20 atoms/cm$^3$. The concentration of the dopant in the doped material region can be greater than approximately 1e19 atoms/cm$^{-3}$. The specific doping level for a specific absorbing material is selected to be sufficient to initiate and sustain free carrier absorption of laser radiation. For absorbing materials with their bandgap of less than approximately 1.3 electron volt (eV), the doping level can be selected in the lower range (e.g. from 3e18 to about 3e19 atoms/cm$^3$) to be able to initiate sufficient laser radiation absorption for subsequent thermal generation of free carriers during annealing. For absorbing materials with their bandgap of larger than approximately 1.3 electron volt (eV), the doping level can be selected in the higher range (e.g. from 3e19 to about 1e21 atoms/cm$^3$) to be able to continuously sustain laser radiation during annealing.

In another embodiment, the absorbing material region is a material region prepared from a semiconductor material with its bandgap being smaller than the photon energy of laser radiation. Suitable semiconductor material includes, for example, a semiconductor Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), GaSb (gallium antimonide), InSb (indium antimonide), or any combination thereof. In an embodiment, the semiconductors with a narrow bandgap include Si, SiGe, GaAs, GaSb, and InSb.

Other exemplary materials to prepare the absorbing material region can include absorbing metals. Metal and metallic compounds may be absorbing at shorter wavelength. For example, copper is absorbing at wavelength shorter than about 600 nm. Accordingly, if the laser radiation is shorter than about 600 nm, the absorbing material layer may include copper. The amount of absorbing metallic element or compound in such material layer can be above about 20% of its total volume. In the case of copper, its higher volume density can be increased by placing additional, dummy interconnects within the absorbing material to bring total interconnect pattern density above about 20%.

The absorbing material region must be of sufficient thickness to allow for the sufficient annealing of the deep metallic interconnect. In one embodiment, the thickness of the absorbing material region is substantially the same as the length of the deep metallic interconnect. In one embodiment, the absorbing material region is at least 3 micrometers thick. In other embodiments, the absorbing material region is at least 7, at least 10, at least 15, at least 20, at least 30, at least 40, or at least 50 micrometers thick. The absorbing material region thicker than the characteristic length of heat spreading becomes less efficient for uniform heating of deep metallic interconnects. Characteristic heat spreading is assessed by thermal diffusion length. The thermal diffusion length is defined as twice the square root of the product of material thermal diffusivity and typical anneal time scale. For instance, the thermal diffusion length is about 70 micrometers for silicon absorbing material with its 0.12 cm$^2$/s thermal diffusivity and 100 microsecond anneal. In some embodiments, the absorbing material region is less than half of its thermal diffusion length at typical anneal time scale.

The absorbing material region is exposed to laser radiation of an appropriate wavelength and for an appropriate duration of time to achieve an annealing temperature suitable to anneal the deep metallic interconnects. The annealing temperature can be something in the range of, for example, about 400 to about 1085° C. (the melting point of copper) and any temperature in between. Another exemplary annealing temperature range can be about 200 to about 1412° C. (the melting point of silicon) and any temperature in between.

The transparent material substrate (10) is generally made from a material that does not substantially absorb the laser radiation used in the annealing process. In an embodiment, the transparent material substrate (10) can be, for example, an undoped or minimally doped semiconductor wafer made from Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof, wherein the bandgap of material substrate (10) is substantially larger than the photon energy of laser radiation As used herein, the term "undoped" means that no dopants were purposefully added to the substrate material either by ion implantation or included in situ during a crystal growth process, or other similar process. As used herein, the term "minimally doped" means the transparent material substrate contains a quantity of dopants which are present at a level where no significant absorption of the laser radiation occurs, i.e. the transparent material is transparent to the laser radiation. In an embodiment, the concentration of dopants in the undoped or minimally doped material substrate can be about 1e16 atoms per cubic centimeter or less.

In another embodiment, the transparent material substrate (10) is a transparent dielectric such as glass, or other suitable transparent material.

The thickness of the transparent material substrate is not limiting and can be in the hundreds of micrometers range, for example, up to about 2000 micrometers, and more specifically about 700 to 800 micrometers thick.

In an embodiment, the structure comprising deep metallic interconnect is a bulk complementary metal-oxide-semiconductor structure.

In an embodiment, the structure comprising deep metallic interconnect is a semiconductor on insulator (SOI) substrate with an epitaxial, doped band located underneath buried oxide layer. This band is from about 3 to 10 micrometer in thickness, has doping level of from about 3e19 to about 1e20 cm$^{-3}$, and forms an absorbing material. An SOI wafer includes a thin layer of a semiconducting material atop an insulating layer (i.e., an oxide layer) which is in turn disposed on a silicon substrate including the doped epitaxial band. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

In an embodiment, the structure comprising deep metallic interconnect is a glass interposer with metallic interconnects and trans glass vias (TGV).

The laser annealing process involves the annealing of deep metallic interconnects by applying laser radiation from the back side of the structure to heat up the material surrounding the deep metallic interconnect to an annealing temperature.

The laser wavelength that is used for the back side annealing process can be selected so that the transparent material substrate is transparent to the radiation, but whose radiation is absorbed by the absorbing material in the absorbing material region to generate sufficient heat to anneal the deep metallic interconnect. The selection of laser wavelength is based, in part, on relating laser photon energy to the energy bandgap of materials in the transparent material layer and absorbing material layer. In an embodiment, the laser photon energy is selected to be substantially smaller than the energy gap of both transparent material and absorbing material. If the transparent material is undoped silicon with its energy gap of about 1 eV at an elevated temperature, then the laser photon energy is selected to be lower than 1 eV or, equivalently, the laser wavelength is selected to be larger than 1.23 micrometers. If the absorbing material is a doped silicon, the free carrier absorption is stronger at a longer wavelength. Non-limiting examples of suitable lasers for heating a doped semiconductor material as the absorbing material region include those that emit far infrared radiation, specifically having a wavelength of between 3 to 20 micrometers. Exemplary infrared lasers include carbon dioxide ($CO_2$) laser with the wavelength at around 10 micrometers.

In an embodiment, the laser photon energy is selected to be substantially smaller than the energy gap of the transparent material but larger than that of the absorbing material. If the transparent material is a glass with its energy gap of about 7-9 eV, then the laser photon energy is selected to be lower than 7 eV or, equivalently, the laser wavelength is selected to be larger than 180 nanometers. If the absorbing material is a semiconductor with the energy bandgap smaller than 1.2 eV, then the laser photon energy is selected to be greater than 1.2 eV or, equivalently, the laser wavelength is selected to be shorter than about 1100 nanometers. If the absorbing material is a metallic-based compound such as dummy copper interconnects, then the laser photon energy is selected to be absorbing in the metallic structure absorbing material. For copper, the laser photon energy should be greater than 2 eV or, equivalently, the laser wavelength is selected to be shorter than about 600 nanometers. Accordingly, non-limiting examples of suitable lasers for heating a semiconductor material as the absorbing material region include those that emit visible and ultraviolet (UV) radiation, specifically having a wavelength of between 180 to 1100 nanometers. Non-limiting examples of suitable lasers for heating a metallic-based material as the absorbing material region include those that emit visible and ultraviolet (UV) radiation, specifically having a wavelength of between 180 to 600 nanometers. Exemplary lasers include Nd:YAG laser at 1060 nm, 532 nm (doubled), 353 nm (tripled), 266 nm (quadrupled), excimer lasers: XeF at 351 mm, XeCl at 308 nm, KrF at 248 nm, ArF at 198 nm, and high power diode InGaAs lasers at 800-900 nm.

The back side laser annealing process can be conducted on short scale, specifically by laser annealing from the nanosecond to the millisecond timeframe. In one embodiment, the back side laser annealing is conducted on a millisecond duration from about 0.05 to about 5 milliseconds. In another embodiment, a longer anneal is conducted, for example 10 milliseconds, to reduce the thermal gradient within the buried interconnects to below a few ° C./micrometer.

The laser may be used in either the pulsed wave mode or the continuous wave mode. The laser annealing can be performed in air. Alternatively, the laser annealing can be performed in an inert gas environment, which can include helium (He), argon (Ar), nitrogen ($N_2$), forming gas ($N_2$:$H_2$), or a combination thereof.

In one embodiment, a laser annealing system scans the laser beam over the fixed structure (wafer). In an alternative embodiment, the laser annealing system comprises a fixed laser beam where the structure (wafer) is moved relative to the fixed beam.

Various parameters to control the laser annealing process involve an optional isothermal substrate heating to an elevated substrate base temperature (as long as such base temperature does not render the transparent material opaque), the laser power density, the radiation exposure time, the scan velocity, and the shape and size of the laser beam. For the scanning system, the radiation exposure time is defined as the beam size in scanning direction at its half maximum divided by the scan velocity. For the pulsed system, the radiation exposure time is defined by the duration of the pulse at its full width at half maximum. The temperature rise from the substrate base temperature to the target temperature is achieved by coupling a certain power density into the substrate during the exposure time. The temperature rise is approximately linear in coupled power density and approximately proportional to the square root of exposure time. The temperature rise from about 300 to about 900° C. with the characteristic exposure time of about 1 millisecond requires from about 10 $kW/cm^2$ to about 40 $kW/cm^2$ of coupled laser power density. In order to achieve the required power density, the laser beam is shaped or focused to relatively small area. In one embodiment, a laser system that is able to deliver of 1 kW of laser power into the substrate is shaped in the form of a line with 200-micrometer width and 1-cm length yielding coupled power density of about 25-50 $kW/cm^2$. The wafer is then scanned with scan velocity of 0.2 m/sec providing exposure time of about 1 millisecond. It should be understood that a change in the exposure time will shift required coupled power density in accordance with the relationship described herein.

In one embodiment, the laser used in the back side annealing process is a gas laser, specifically a $CO_2$ laser, and more specifically a 10.6 micrometer wavelength $CO_2$ laser. Within this embodiment, the transparent material substrate can be an undoped or minimally doped semiconductor material and the absorbing material region can be a doped semiconductor material region as described herein.

The back side laser annealing can be performed using a dual laser beam process. For the back side laser annealing performed using a dual laser beam process, an auxiliary second laser can be employed from the wafer front side while the main laser beam is coupled from the back side. The purpose of this auxiliary second laser is to make the material in layer (20) to be more absorbing and thus aiding absorption of the main beam. For the dual beam laser system, while the two lasers are used simultaneously, modulating auxiliary laser intensity provides an independent control for coupling main laser power into the absorbing layer (20). Modulating auxiliary laser intensity includes switching power of auxiliary laser with a predetermined repetition rate. The auxiliary laser wavelength is selected to provide efficient coupling into and absorption within the absorbing layer (20). In one embodiment, the auxiliary front side laser is the diode laser with the wavelength of from about 800 to about 900 nm while the main back side laser is the a $CO_2$ laser, and more specifically a 10.6 micrometer wavelength. The power density of auxiliary front side laser is substantially smaller than that of the main laser and is from about 1 $kW/cm^2$ to about 10 $kW/cm^2$.

One advantage of laser annealing is its short duration that allows for high-temperature annealing of targeted structures without inducing much damage to the surrounding areas. The short scale annealing confines the region of high temperature annealing to within the proximity of wafer surfaces creating obstacles to uniform annealing of deep, buried metallic interconnects. The backside through-wafer coupling into a buried absorbing region overcomes this obstacle. Further, the temperature pattern effects due to non-uniform front side laser radiation coupling are reduced.

In another embodiment, an additional laser annealing of the metallic interconnect is further conducted from the front side of the substrate. This additional laser annealing provides heating of the top portion of deep metallic interconnects and may aid in achieving overall annealing uniformity for these structures. There is no particular order when both annealing processes are employed.

In one embodiment, the back side laser annealing process is conducted prior to the front side annealing process. In another embodiment, the front side laser annealing process is conducted prior to the back side annealing process.

Figure 2:
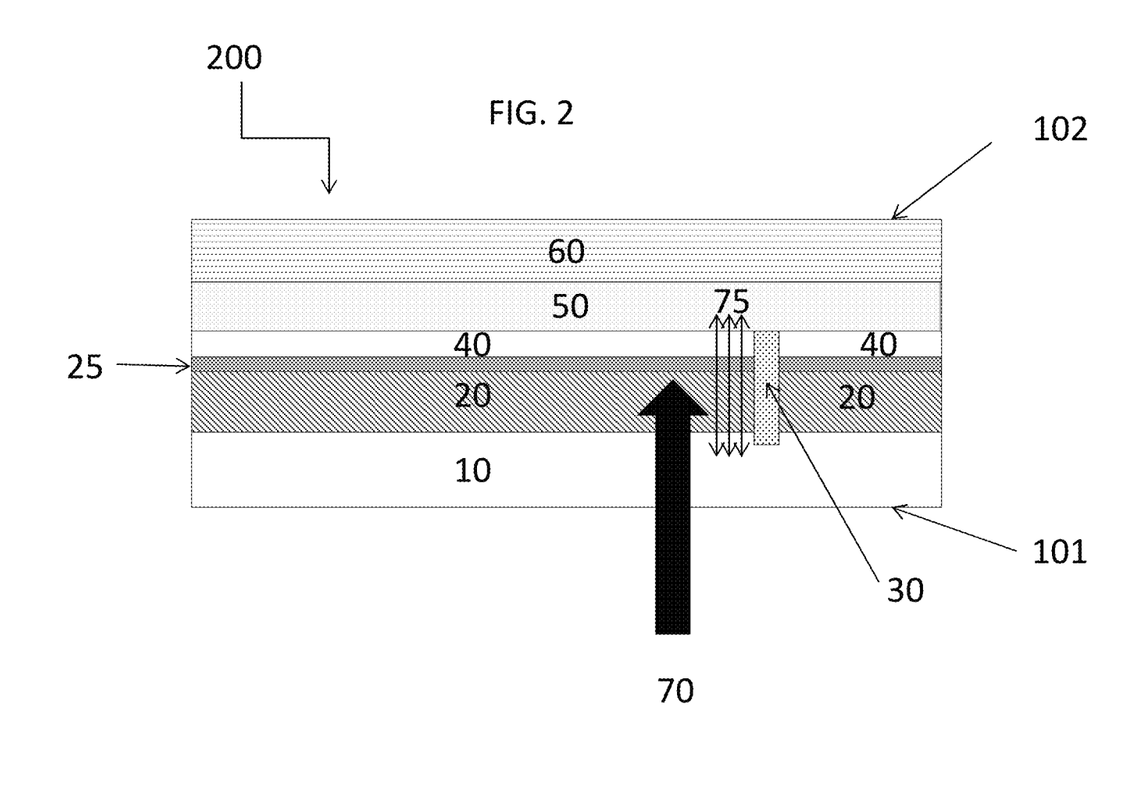
FIG. 2 is a schematic of laser annealing a metallic interconnect from the back side of a second structure.

The optional sacrificial protective layer (60) of FIG. 1 and FIG. 2 can be used to prevent scratches on the front side of the device during the annealing process. Suitable materials for the sacrificial protective layer include amorphous carbons, and the like. The sacrificial protective layer can be applied using a coating process. Once the laser annealing step has been conducted the sacrificial protective layer can be removed, for example using an ash strip process. Ashing is performed using a suitable reaction gas, for example, $O_2$, $N_2$, $H_2/N_2$, $O_3$, $CF_4$, or any combination thereof.

An optional back end of line (BEOL) or middle of line (MOL) component region (50), and an optional sacrificial protective layer (60) can be present in the structure during the annealing process. Exemplary BEOL components include contacts, pads, dielectric structures, interconnect wires, vias, and the like.

FIG. 2 is another exemplary embodiment of the present invention where structure (200) has a back side surface (101) and a front side (102). Structure (200) contains an transparent material substrate (10), an absorbing material region (20), a diffusion barrier layer (25), a deep metallic interconnect (30), a semiconductor device region (40), an optional back end of line (BEOL) or middle of line (MOL) component region (50), and an optional sacrificial protective layer (60). Laser radiation (70) emitted from a laser source (not shown) enters through the back side surface (101) of structure (200) and travels through the transparent material substrate (10) without being substantially absorbed by the transparent material. The laser energy used is high enough to heat the absorbing material region to a sufficient annealing temperature, the heat diffuses (75) through the absorbing material region (as shown by the double-headed arrows (75) in FIG. 2) to heat the deep metallic interconnect, thereby annealing the metal therein. As shown in FIG. 2, by controlling the laser annealing process, the heat (75) can diffuse down through the absorbing material region (20) to a portion of the transparent material substrate (10) and the heat (75) can diffuse up through the diffusion barrier layer (25) to a portion of the semiconductor device region (40) and optional back end of line (BEOL) or middle of line (MOL) component region (50). The diffusion barrier layer (25) is made from a material that minimizes or prevents dopants from diffusing from the absorbing material region (20), when prepared from a doped material, to the semiconductor device region (40). In one embodiment, the diffusion barrier (25) is a buried oxide layer of an SOI substrate. In another embodiment, the diffusion barrier (25) is a semiconducting layer with additives that retard diffusion of the dopant in material (20). Specifically, the additive is carbon and the dopant in layer (20) is phosphorus or boron.

In one embodiment, the laser annealing of a deep metallic interconnect is conducted before any BEOL or other back end interconnects are built above that particular deep metallic interconnect. In an alternative embodiment, the laser annealing of a deep metallic interconnect is conducted after the formation of, e.g., MOL contacts, BEOL M1 first metallization layer level build, after a Cu interconnect build in the far BEOL, and/or the like. In such an embodiment, the back side anneal can anneal BEOL, MOL, device layer, or a combination thereof during the annealing of the deep buried interconnects.

In one embodiment, a method of annealing deep metallic interconnects such as TSV comprises providing a structure comprising (from back to front) a transparent material substrate, which can be an undoped material substrate, which forms the back side of the structure, an absorbing material region, which can be a doped material region, located in front of the transparent material substrate opposite to the back side of the structure, a semiconductor device region located in front of the absorbing material region opposite to the transparent material substrate, a metallic interconnect located within the absorbing material region and semiconductor device region forming a vertical electrical connection (via), and back end of line (BEOL) or middle of line (MOL) component region located in front of the absorbing material region; optionally coating the front side of the structure with a sacrificial protective layer to cover the surface of the semiconductor device region, the metallic interconnect, and back end of line (BEOL) or middle of line (MOL) component region; laser annealing the metallic interconnect through the back side of the structure using a laser having a wavelength that the transparent material substrate is transparent and wherein the absorbing material region absorbs the laser radiation; optionally laser annealing the metallic interconnect through the front side of the structure; and optionally stripping the sacrificial protective layer if used.

Within the above method, the process may involve providing the structure, coating the front side with a sacrificial protective layer, flipping the structure to expose the back side, laser annealing the metallic interconnect through the back side of the structure using an infrared laser, flipping the structure, laser annealing the metallic interconnect through the front side of the structure, and stripping the sacrificial protective layer.

In an embodiment, an apparatus for laser annealing deep metallic interconnects comprises an infrared laser and a coupling device that couples laser radiation from the infrared laser to the back side of a target structure, the target structure comprising, from back to front, a transparent material substrate, which can be an undoped material substrate, which forms the back side of the structure, an absorbing material region, which can be a doped material region, located in front of the transparent material substrate opposite to the back side of the structure, a semiconductor device region located in front of the absorbing material region opposite to the transparent material substrate, a metallic interconnect located within the absorbing material region and semiconductor device region forming a vertical electrical connection (via), and back end of line (BEOL) or middle of line (MOL) component region located in front of the absorbing material region, wherein the laser radiation heats the absorbing material region to an annealing temperature sufficient to anneal deep metallic interconnects present therein.

In another embodiment, an apparatus for laser annealing deep metallic interconnects comprises a first laser with the first wavelength and a first coupling device that couples laser radiation from the first laser to the back side of a structure and a second laser with a second wavelength, shorter than the first wavelength, and a second coupling device that couples the second laser radiation from the second laser to the front side. The structure comprising, from back to front, a transparent material substrate, which can be an undoped material substrate, which forms the back side of the structure, a semiconductor device region located in front of the transparent material substrate opposite to the back side of the structure, a metallic interconnect located within the transparent material substrate and semiconductor device region forming a vertical electrical connection (via), and back end of line (BEOL) or middle of line (MOL) component region located in front of the transparent material substrate, wherein the second laser radiation creates the absorbing material region and the first laser radiation couples into the created absorbing material and heats it to an annealing temperature sufficient to anneal deeply buried metallic interconnects present therein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof. The endpoints of all ranges directed to the same component or property are inclusive of the endpoints, are independently combinable, and include all intermediate points and ranges.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for laser annealing deep metallic interconnects, comprising:
    a first laser with a first wavelength and a first coupling device, and
    a second laser with a second wavelength, shorter than the first wavelength, and a second coupling device,
    wherein the first coupling device couples laser radiation from the first laser to the back side of a target structure to be laser annealed and the second coupling device couples the second laser radiation from the second laser to the front side of the target structure to be laser annealed;
    wherein the target structure contains, from back to front, a transparent material substrate which forms the back side of the structure, a semiconductor device region located in front of the transparent material substrate opposite to the back side of the structure, a metallic interconnect located within the transparent material substrate and semiconductor device region forming a vertical electrical connection (via), and optional back end of line (BEOL) or middle of line (MOL) component region located in front of the transparent material substrate, and
    wherein the second laser radiation creates an absorbing material region and the first laser radiation couples into the created absorbing material and heats it to an annealing temperature sufficient to anneal the metallic interconnect present therein.

2. The apparatus of claim 1, wherein the first laser has a laser photon energy selected to be smaller than the energy gap of both the transparent material and the absorbing material.

3. The apparatus of claim 1, wherein the metallic interconnect comprises copper, a copper alloy, Al, Co, or W.

4. The apparatus of claim 1, wherein the absorbing material region is a doped material region that is doped Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof; or the absorbing material region is an absorbing metal.

5. The apparatus of claim 4, wherein the doped material region comprises a dopant selected from the group consisting of Group III, Group V elements, or a combination thereof.

6. The apparatus of claim 1, wherein the absorbing material region has a thickness of at least 3 micrometers.

7. The apparatus of claim 1, wherein the laser annealing is conducted on a nanosecond or millisecond time frame.

8. The apparatus of claim 1, wherein the first wavelength is between 3 and 20 micrometers.

9. The apparatus of claim 1, wherein the second wavelength is between 3 and 20 micrometers.

\* \* \* \* \*